United States Patent
Lai et al.

(10) Patent No.: US 7,599,217 B2
(45) Date of Patent: Oct. 6, 2009

(54) MEMORY CELL DEVICE AND MANUFACTURING METHOD

(75) Inventors: Erh-Kun Lai, Longjing Shiang (TW); Chiahua Ho, Kaoshing (TW); Kuang Yeu Hsieh, Hsinchu County (TW)

(73) Assignee: Macronix International Co., Ltd., Hsinchu (TW)

( * ) Notice: Subject to any disclaimer, the term of this patent is extended or adjusted under 35 U.S.C. 154(b) by 131 days.

(21) Appl. No.: 11/357,902

(22) Filed: Feb. 17, 2006

(65) Prior Publication Data

US 2007/0117315 A1 May 24, 2007

Related U.S. Application Data

(60) Provisional application No. 60/738,924, filed on Nov. 22, 2005.

(51) Int. Cl.
*G11C 11/00* (2006.01)
(52) U.S. Cl. .................. 365/163; 365/63; 365/148
(58) Field of Classification Search ............ 257/2, 257/4, 5; 365/148, 163, 63
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,452,592 A | 6/1984 | Tsai | |
| 4,599,705 A | 7/1986 | Holmberg et al. | |
| 4,719,594 A | 1/1988 | Young et al. | |
| 4,769,339 A | 9/1988 | Ishii et al. | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |

(Continued)

FOREIGN PATENT DOCUMENTS

WO    WO 00/45108 A1    8/2000

(Continued)

OTHER PUBLICATIONS

Bedeschi, F. et al., "4-MB MOSFET-Selected Phase-Change Memory Experimental Chip," IEEE, 2004, 4 pp.

(Continued)

*Primary Examiner*—Richard Elms
*Assistant Examiner*—Alexander Sofocleous
(74) *Attorney, Agent, or Firm*—James F. Hann; Haynes Beffel & Wolfeld LLP (57) ABSTRACT

A memory cell device, having a memory material switchable between electrical property states by the application of energy, comprises an electrode, a separation layer against an electrode surface, a hole in the separation layer, a second material in the hole defining a void having a downwardly and inwardly tapering void region. A memory material is in the void region in electrical contact with the electrode surface. A second electrode is in electrical contact with the memory material. Energy passing between the first and second electrodes is concentrated within the memory material so to facilitate changing an electrical property state of the memory material. The memory material may comprise a phase change material. The second material may comprise a high density plasma-deposited material. A method for making a memory cell device is also discussed.

10 Claims, 3 Drawing Sheets

U.S. PATENT DOCUMENTS

| | | |
|---|---|---|
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |
| 5,754,472 A | 5/1998 | Sim et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji et al. |
| 6,066,870 A | 5/2000 | Siek |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,830,952 B2 | 12/2004 | Lung et al. |
| 6,838,692 B1 | 1/2005 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen et al. |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung et al. |

| | | | | | | |
|---|---|---|---|---|---|---|
| 7,078,273 | B2 | 7/2006 | Matsuoka et al. | 2006/0006472 A1 | 1/2006 | Jiang |
| 7,099,180 | B1 | 8/2006 | Dodge et al. | 2006/0038221 A1 | 2/2006 | Lee et al. |
| 7,115,927 | B2 | 10/2006 | Hideki et al. | 2006/0066156 A1 | 3/2006 | Dong et al. |
| 7,122,281 | B2 | 10/2006 | Pierrat | 2006/0073642 A1 | 4/2006 | Yeh et al. |
| 7,122,824 | B2 | 10/2006 | Khouri et al. | 2006/0091476 A1 | 5/2006 | Pinnow et al. |
| 7,126,149 | B2 | 10/2006 | Iwasaki et al. | 2006/0094154 A1 | 5/2006 | Lung |
| 7,132,675 | B2 | 11/2006 | Gilton | 2006/0108667 A1 | 5/2006 | Lung |
| 7,154,774 | B2 | 12/2006 | Bedeschi et al. | 2006/0110878 A1 | 5/2006 | Lung et al. |
| 7,164,147 | B2 | 1/2007 | Lee et al. | 2006/0110888 A1 | 5/2006 | Cho et al. |
| 7,166,533 | B2 | 1/2007 | Happ | 2006/0113520 A1 | 6/2006 | Yamamoto et al. |
| 7,169,635 | B2 | 1/2007 | Kozicki | 2006/0113521 A1 | 6/2006 | Lung |
| 7,202,493 | B2 | 4/2007 | Lung et al. | 2006/0118913 A1 | 6/2006 | Yi et al. |
| 7,208,751 | B2 | 4/2007 | Ooishi et al. | 2006/0124916 A1 | 6/2006 | Lung |
| 7,214,958 | B2 * | 5/2007 | Happ ............................ 257/4 | 2006/0126395 A1 | 6/2006 | Chen et al. |
| 7,220,983 | B2 | 5/2007 | Lung | 2006/0131555 A1 | 6/2006 | Liu et al. |
| 7,229,883 | B2 | 6/2007 | Wang et al. | 2006/0138467 A1 | 6/2006 | Lung |
| 7,238,959 | B2 | 7/2007 | Chen | 2006/0154185 A1 | 7/2006 | Ho et al. |
| 7,238,994 | B2 | 7/2007 | Chen et al. | 2006/0157681 A1 | 7/2006 | Chen et al. |
| 7,248,494 | B2 | 7/2007 | Oh et al. | 2006/0163554 A1 | 7/2006 | Lankhorst et al. |
| 7,251,157 | B2 | 7/2007 | Osada et al. | 2006/0175599 A1 | 8/2006 | Happ |
| 7,253,429 | B2 | 8/2007 | Klersy et al. | 2006/0198183 A1 | 9/2006 | Kawahara et al. |
| 7,254,059 | B2 | 8/2007 | Li et al. | 2006/0205108 A1 | 9/2006 | Maimon et al. |
| 7,269,052 | B2 | 9/2007 | Segal et al. | 2006/0211165 A1 | 9/2006 | Hwang et al. |
| 7,277,317 | B2 | 10/2007 | Le Phan et al. | 2006/0226409 A1 | 10/2006 | Burr et al. |
| 7,291,556 | B2 | 11/2007 | Choi et al. | 2006/0234138 A1 | 10/2006 | Fehlhaber et al. |
| 7,309,630 | B2 | 12/2007 | Fan et al. | 2006/0237756 A1 | 10/2006 | Park et al. |
| 7,321,130 | B2 | 1/2008 | Lung et al. | 2006/0266993 A1 | 11/2006 | Suh et al. |
| 7,323,708 | B2 | 1/2008 | Lee et al. | 2006/0284157 A1 | 12/2006 | Chen et al. |
| 7,332,370 | B2 | 2/2008 | Chang et al. | 2006/0284158 A1 | 12/2006 | Lung et al. |
| 7,336,526 | B2 | 2/2008 | Osada et al. | 2006/0284214 A1 | 12/2006 | Chen |
| 7,351,648 | B2 | 4/2008 | Furukawa et al. | 2006/0284279 A1 | 12/2006 | Lung et al. |
| 7,359,231 | B2 | 4/2008 | Venkataraman et al. | 2006/0286709 A1 | 12/2006 | Lung et al. |
| 7,364,935 | B2 | 4/2008 | Lung et al. | 2006/0286743 A1 | 12/2006 | Lung et al. |
| 7,365,385 | B2 | 4/2008 | Abbott | 2006/0289848 A1 | 12/2006 | Dennison |
| 7,379,328 | B2 | 5/2008 | Osada et al. | 2007/0008786 A1 | 1/2007 | Scheuerlein |
| 7,385,235 | B2 | 6/2008 | Lung et al. | 2007/0030721 A1 | 2/2007 | Segal et al. |
| 7,394,088 | B2 | 7/2008 | Lung | 2007/0037101 A1 | 2/2007 | Morioka |
| 7,397,060 | B2 | 7/2008 | Lung | 2007/0096162 A1 * | 5/2007 | Happ et al. ................. 257/246 |
| 7,423,300 | B2 | 9/2008 | Lung et al. | 2007/0096248 A1 * | 5/2007 | Philipp et al. ............... 257/528 |
| 7,426,134 | B2 | 9/2008 | Happ et al. | 2007/0108077 A1 | 5/2007 | Lung et al. |
| 7,440,308 | B2 | 10/2008 | Jeong et al. | 2007/0108429 A1 | 5/2007 | Lung |
| 7,449,710 | B2 | 11/2008 | Lung | 2007/0108430 A1 | 5/2007 | Lung |
| 2001/0055838 A1 * | | 12/2001 | Walker et al. ................ 438/129 | 2007/0108431 A1 | 5/2007 | Chen et al. |
| 2002/0070457 A1 | | 6/2002 | Sun et al. | 2007/0109836 A1 | 5/2007 | Lung |
| 2002/0072223 A1 | | 6/2002 | Gilbert et al. | 2007/0109843 A1 | 5/2007 | Lung et al. |
| 2002/0081833 A1 | | 6/2002 | Li et al. | 2007/0111429 A1 | 5/2007 | Lung |
| 2002/0113273 A1 | | 8/2002 | Hwang et al. | 2007/0115794 A1 | 5/2007 | Lung |
| 2003/0072195 A1 | | 4/2003 | Mikolajick | 2007/0117315 A1 | 5/2007 | Lai et al. |
| 2003/0095426 A1 | | 5/2003 | Hush et al. | 2007/0121363 A1 | 5/2007 | Lung |
| 2003/0186481 A1 | | 10/2003 | Lung | 2007/0121374 A1 | 5/2007 | Lung et al. |
| 2004/0026686 A1 | | 2/2004 | Lung | 2007/0126040 A1 | 6/2007 | Lung |
| 2004/0051094 A1 | | 3/2004 | Ooishi | 2007/0131922 A1 | 6/2007 | Lung |
| 2004/0113137 A1 | | 6/2004 | Lowrey | 2007/0131980 A1 | 6/2007 | Lung |
| 2004/0165422 A1 | | 8/2004 | Hideki et al. | 2007/0138458 A1 | 6/2007 | Lung |
| 2004/0178172 A1 | | 9/2004 | Huang et al. | 2007/0147105 A1 | 6/2007 | Lung et al. |
| 2004/0248339 A1 | | 12/2004 | Lung | 2007/0153563 A1 | 7/2007 | Nirschl |
| 2004/0256610 A1 | | 12/2004 | Lung | 2007/0154847 A1 | 7/2007 | Chen et al. |
| 2005/0018526 A1 | | 1/2005 | Lee | 2007/0155172 A1 | 7/2007 | Lai et al. |
| 2005/0029502 A1 | | 2/2005 | Hudgens | 2007/0158632 A1 | 7/2007 | Ho |
| 2005/0062087 A1 | | 3/2005 | Chen et al. | 2007/0158633 A1 | 7/2007 | Lai et al. |
| 2005/0093022 A1 | | 5/2005 | Lung | 2007/0158645 A1 | 7/2007 | Lung |
| 2005/0106919 A1 | | 5/2005 | Layadi et al. | 2007/0158690 A1 | 7/2007 | Ho et al. |
| 2005/0127349 A1 | | 6/2005 | Horak et al. | 2007/0158862 A1 | 7/2007 | Lung |
| 2005/0130414 A1 | | 6/2005 | Choi et al. | 2007/0161186 A1 | 7/2007 | Ho |
| 2005/0145984 A1 | | 7/2005 | Chen et al. | 2007/0170881 A1 | 7/2007 | Noh et al. |
| 2005/0167656 A1 | | 8/2005 | Sun et al. | 2007/0173019 A1 | 7/2007 | Ho et al. |
| 2005/0191804 A1 | | 9/2005 | Lai et al. | 2007/0173063 A1 | 7/2007 | Lung |
| 2005/0201182 A1 | | 9/2005 | Osada et al. | 2007/0176261 A1 | 8/2007 | Lung |
| 2005/0212024 A1 | | 9/2005 | Happ | 2007/0187664 A1 | 8/2007 | Happ |
| 2005/0212026 A1 | | 9/2005 | Chung et al. | 2007/0201267 A1 | 8/2007 | Happ et al. |
| 2005/0215009 A1 | | 9/2005 | Cho | 2007/0215852 A1 | 9/2007 | Lung |
| 2005/0263829 A1 | | 12/2005 | Song et al. | 2007/0224726 A1 | 9/2007 | Chen et al. |
| 2005/0285096 A1 | | 12/2005 | Kozicki | 2007/0235811 A1 | 10/2007 | Furukawa et al. |

| | | |
|---|---|---|
| 2007/0236989 A1 | 10/2007 | Lung |
| 2007/0246699 A1 | 10/2007 | Lung |
| 2007/0249090 A1 | 10/2007 | Philipp et al. |
| 2007/0257300 A1 | 11/2007 | Ho et al. |
| 2007/0262388 A1 | 11/2007 | Ho et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0137400 A1 | 6/2008 | Chen et al. |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |

FOREIGN PATENT DOCUMENTS

| | | |
|---|---|---|
| WO | WO 00/79539 A1 | 12/2000 |
| WO | WO 01/45108 A1 | 6/2001 |
| WO | 0225733 | 3/2002 |

OTHER PUBLICATIONS

Gibson, G.A. et al., "Phase-change Recording Medium that Enables Ultrahigh-density Electron-beam Data Storage," Applied Physics Letter, 2005, 3 pp., vol. 86.
Happ, T.D. et al., "Novel None-Mask Self-Heating Pillar Phase Change Memory," 2006 Symposium on VLSI Technology, 2 pp.
Hudgens, S. et al., "Overview of Phase-Change Chalcogenide Nonvolatile Memory Technology," MRS Bulletin, Nov. 2004, pp. 829-832.
Iwasaki, Hiroko et al, "completely Erasable Phase Change Optical Disk," Jpn. J. Appl. Phys., Feb. 1992, pp. 461-465, vol. 31.
Lacita, A. L.; "Electrothermal and Phase-change Dynamics in Chalcogenide-based Memories," IEEE IEDM 2004, 4 pp.
"Magnetic Bit Boost," www.sciencenews.org <http://www.sciencenews.org>, Dec. 18 & 25, 2004, p. 389, vol. 166.
"New Memories Tap Spin, Gird for Battle," Science News, Apr. 3, 1999, p. 223, vol. 155.
Pirovano, Agostino et al., "Reliability Study of Phase-Change Nonvolatile Memories," IEEE Transactions on Device and Materials Reliability, Sep. 2004, pp. 422-427, vol. 4, No. 3.
Radaelli, A. et al., "Electronic Switching Effect and Phase-Change Transition in Chalcogenide Materials," IEEE Electron Device Letters, Oct. 2004, pp. 684-686, vol. 25, No. 10.
"Remembering on the Cheap," www.sciencenews.org <http://www.sciencenews.org>, Mar. 19, 2005, p. 189, vol. 167.
Wuttig, Matthias, "Towards a Universal Memory?" Nature Materials, Apr. 2005, pp. 265-266, vol. 4.
Ahn, S. J. et al., "Highly Reliable 5nm Contact Cell Technology for 256Mb PRAM," VLSI Technology, Digest of Technical Papers, Jun. 14-16, 2005, pp. 98-99.
Adler, David, "Amorphous-Semiconductor Devices," Sci. Amer., vol. 236, pp. 36-48, May 1977.
Adler, D. et al., "Threshold Switching in Chalcogenide-Glass Thin Films," J. Appl/ Phys 51(6), Jun. 1980, pp. 3289-3309.
Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.
Blake thesis, "Investigation of GeTeSb5 Chalcogenide Films for Use as an Analog Memory," AFIT/GE/ENG/00M-04, Mar. 2000, 121 pages.
Chen, An et al., "Non-Volatile Resistive Switching for Advanced Memory Applications," IEEE IEDM , Dec. 5-7, 2005, 4 pp.
Cho, S. L. et al., "Highly Scalable On-axis Confined Cell Structure for High Density PRAM beyond 256Mb," 2005 Symposium on VLSI Technology Digest of Technical Papers, pp. 96-97.
Gill, Manzur et al., "A High-Performance Nonvolatile Memory Technology for Stand-Alone Memory and Embedded Applications," 2002 IEEE-ISSCC Technical Digest (TD 12.4), 7 pp.
Ha, Y. H. et al. "An Edge Contact Type Cell fro Phase Change RAM Featuring Very Low Power Consumption," 2003 Symposium on VLSI Technology Digest of Technical Papers, pp. 175-176.
Haring Bolivar, P. et al., "Lateral Design for Phase Change Random Access Memory Cells with Low-Current Consumption," presented at $3^{rd}$ E*PCOS 04 Symposium in Balzers, Principality of Liechtenstein, Sep. 4-7, 2004, 4 pp.
Horii, H. et al., "A Novel Cell Technology Using N-doped GeSbTe Films for Phase Change RAM," 2003 Symposium on VLSI Technology Digest of Technical Papers, pp. 177-178.
Hwang, Y. N. et al., "Full Integration and Reliability Evaluation of Phase-change RAM Based on 0.24 µm-CMOS Technologies," 2003 Symposium on VLSI Technology Digest of Technical Papers, pp. 173-174.
Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.
Kim, Kinam et al., "Reliability Investigations for Manufacturable High Density PRAM," IEEE $43^{rd}$ Annual International Reliability Physics Symposium, San Jose, 2005, pp. 157-162.
Kojima, Rie et al., "Ge-Sn-Sb-Te Phase-change Recording Material Having High Crystallization Speed," Proceedings of PCOS 2000, pp. 36-41.
Lai, Stefan, "Current Status of the Phase Change Memory and Its Future," IEEE IEDM 2003, pp. 255-258.
Lai, Stephan et al., OUM-A 180 nm Nonvolatile Memory Cell Element Technology for Stand Alone and Embedded Applications, IEEE IEDM 2001, pp. 803-806.
Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.
Mott, Nevill, "Electrons in Glass," Nobel Lecture, Dec. 8, 1977, Physics, 1977, pp. 403-413.
Ovshinsky, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.
Pellizer, F. et al., "Novel µTrench Phase-Change Memory Cell for Embedded and Stand-Alone Non-Volatile Memory Applications," 2004 Symposium on VLSI Technology Digest of Technical Papers, pp. 18-19.
Prakash, S. et al., "A Guideline for Designing Chalcogenide-Based Glasses for Threshold Switching Characteristics," IEEE Electron Device Letters, vol. 18, No. 2, Feb. 1997, pp. 45-47.
Rochefort, C. et al., "Manufacturing of High Aspect-Ration p-n Junctions Using Vapor Phase Doping for Application in Multi-Resurf Devices," IEEE 2002.
Strauss, Karl F. et al., "Overview of Radiation Tolerant Unlimited Write Cycle Non-Volatile Memory," IEEE 2000.
Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.
Wicker, Guy, "A Comprehensive Model of Submicron Chalcogenide Switching Devices," Doctoral Dissertation, Wayne State University, Detroit, MI, 1996.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

"Optimized Thermal Capacitance in a Phase Change Memory Cell Design," IPCOM000141986D, IP.com Prior Art Database, Oct. 18, 2006, 4pp.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Atwood, G, et al., "90 nm Phase Change Technology with u Trench and Lance Cell Elements," VLSI Technology, Systems and Applications, Apr. 23-25, 2007, pp. 1-2.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Gleixner, "Phase Change Memory Reliability", 22nd NVSMW, Aug. 26, 2007, 46 pages.

Ovonyx Non-Confidential paper entitled "Ovonic Unified Memory," Dec. 1999, pp. 1-80.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wolf, Stanley, Excerpt from: Silicon Processing for the VLSI Era—vol. 4, pp. 674-679, 2004.

Yamada, Noboru, "Potential of Ge-Sb-Te phase-change optical disks for high-data-rate recording in the near future," (Conference Proceedings Paper), Jul. 30, 1997, vol. 3109, 10 pages.

\* cited by examiner

MEMORY CELL DEVICE AND MANUFACTURING METHOD

CROSS REFERENCE TO RELATED APPLICATIONS

This application claims the benefit of provisional patent application No. 60/738,924 filed 22 Nov. 2005.

BACKGROUND OF THE INVENTION

1. Field of the Invention

The present invention relates to high density memory devices based on memory materials, for example resistor random access memory (RRAM) devices, the memory material switchable between electrical property states by the application of energy. The memory materials may be phase change based memory materials, including chalcogenide based materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state; this difference in resistance can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and by reducing the size of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very small dimensions, and with variations in process that meet tight specifications needed for large-scale memory devices. It is desirable therefore to provide a memory cell structure having small dimensions and low reset currents, and a method for manufacturing such structure.

SUMMARY OF THE INVENTION

A first aspect of the invention is directed to a memory cell device of the type including a memory material switchable between electrical property states by the application of energy. The memory cell device comprises a first electrode having an electrode surface. A first material is over the electrode surface to create a separation layer having an upper surface. The first material defines a hole bounded by a side wall within the separation layer, a bottom, and a plane defined by the upper surface. A second material and is on the side wall with the second material defining a void. The void has a downwardly and inwardly tapering void region below the plane of the upper surface. A memory material is in at least a portion of the void region and is in electrical contact with the electrode surface. A second electrode is an electrical contact with the memory material. Energy passing between the first and second electrodes is concentrated within the memory material so to facilitate changing an electrical property state of the memory material. In some embodiment the memory material comprises a phase change material. The second material may comprise a high density plasma-deposited material.

A second aspect of the invention is directed a method for making a memory cell device of the type including a memory material switchable between electrical property states by the application of energy. They first electrode is formed, the first electrode having an electrode surface. A first material is deposited over the electrode surface to create a separation layer having an upper surface. A hole is formed through the separation layer. The hole is bounded by a side wall within the separation layer, a bottom, and a plane defined by the upper surface. A deposition procedure is selected. A second material is deposited on the side wall using the selected procedure. The selecting and second material depositing steps are carried out so that the second material defines a void. The void has a downwardly and inwardly tapering void region below the plane of the upper surface. A memory material is deposited in at least a portion of the void region and in electrical contact with the electrode surface. A second electrode is formed in electrical contact with the memory material. Energy passing between the first and second electrodes is concentrated within the memory material so to facilitate changing an electrical property state of the memory material. In some embodiments the selecting step comprises selecting a high density plasma chemical vapor deposition (HDP CVD) procedure and the depositing step comprises depositing, using the selected HDP CVD procedure, the second material on the side wall.

The method described herein for formation of a memory cell device and, for example, in an RRAM device, can be used to make small phase change gates, bridges or similar structures for other devices.

Various features and advantages of the invention will appear from the following description in which the preferred embodiments have been set forth in detail in conjunction with the accompanying drawings.

BRIEF DESCRIPTION OF THE DRAWINGS

FIGS. 2-5 illustrate a method for making memory cell devices, such as the device of FIG. 1;

DETAILED DESCRIPTION

The following description of the invention will typically be with reference to specific structural embodiments and methods. It is to be understood that there is no intention to limit the invention to the specifically disclosed embodiments and methods but that the invention may be practiced using other features, elements, methods and embodiments. Like elements in various embodiments are commonly referred to with like reference numerals.

Figure 1:
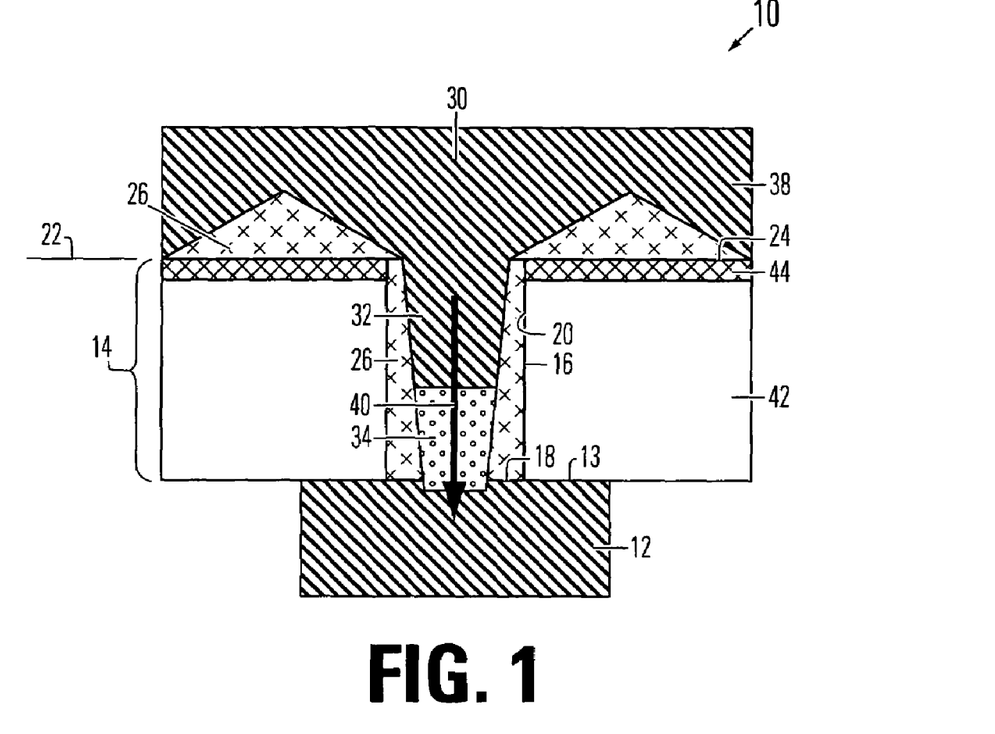
FIG. 1 is a simplified cross-sectional view of a memory cell device made according to the invention.

FIG. 1 is a simplified cross-sectional view of a memory cell device 10 made according to one embodiment of the invention. Device 10 comprises broadly a first, bottom electrode 12 having an electrode surface 13 onto which a separation layer 14 is deposited. A hole 16 is formed through separation layer 14 down to first electrode 12. Hole 16 is bounded by a bottom 18, a side wall 20 and a plane 22 defined by the upper surface 24 of separation layer 14. A material 26 is deposited on upper surface 24, side wall 20 and bottom 18 preferably using a high density plasma chemical vapor deposition (HDP CVD) process. Doing so creates a void 28 including a first downwardly and inwardly tapering void region 30 above plane 22 and a second downwardly and inwardly tapering void region 32 below plane 22. A memory material 34 is deposited within the lower portion 36 of second void region 32 in contact with first electrode 12. Finally, a second or top electrode 38 is formed on top of material 26 and in contact with memory material 34. As suggested in FIG. 1, current flow 40 is confined to flow through a relatively small volume of memory material.

Figure 2:
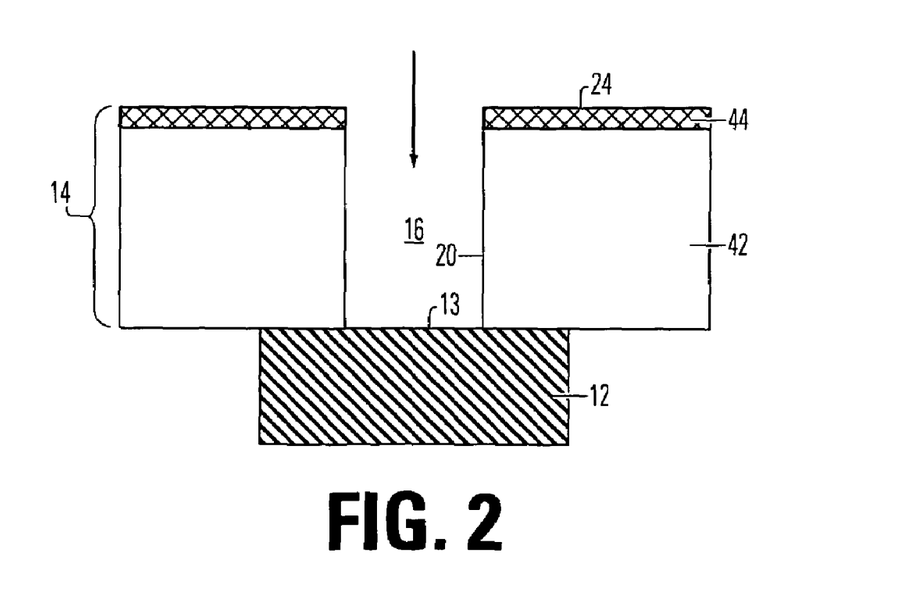
FIG. 2 illustrates the deposition of material over a first electrode to create a separation layer above the first electrode, the separation layer having a hole formed therethrough to the first electrode.

Memory cell device 10 and its method of manufacturer will be described with reference to FIGS. 2-11. Referring now to FIG. 2, separation layer 14 has been deposited over first electrode 12 and hole 16 has been patterned through separation layer 14 with the bottom 18 of the hole exposing electrode surface 13. In some embodiments bottom 18 of hole 16 may be above, rather than at, electrode surface 13. Hole 16 preferably has a diameter of about 200 to 50 nm, typically about 100 nm. Separation layer 14 comprises, in this embodiment, an intermetal dielectric material layer 42 of, for example, SiO2; other materials, such as FSG/PSG/BPSG or a Low-K dielectric may also be used. Intermetal dielectric material layer 42 preferably has a thickness of about 100 to 300 nm, typically about 200 nm. An etch stop layer 44 is applied over layer 42 to protect layer 42 during subsequent processing steps. The etch stop layer 44 not only serves as a dielectric anti-reflective coatings (DARC) for hole patterning, but also protects layer 42 during HDP deposition procedures because HDP deposition involves not only deposition, but also high density plasma etching. Etch stop layer 44 protects layer 42 during HDP high density plasma etch to maintain the shape of hole 16. Etch stop layer 44 comprises, in this embodiment, SiON; other materials, such as SiN, may also be used. Etch stop layer 44 preferably has a thickness of about 10 to 50 nm, typically about 30 nm.

Figure 3:
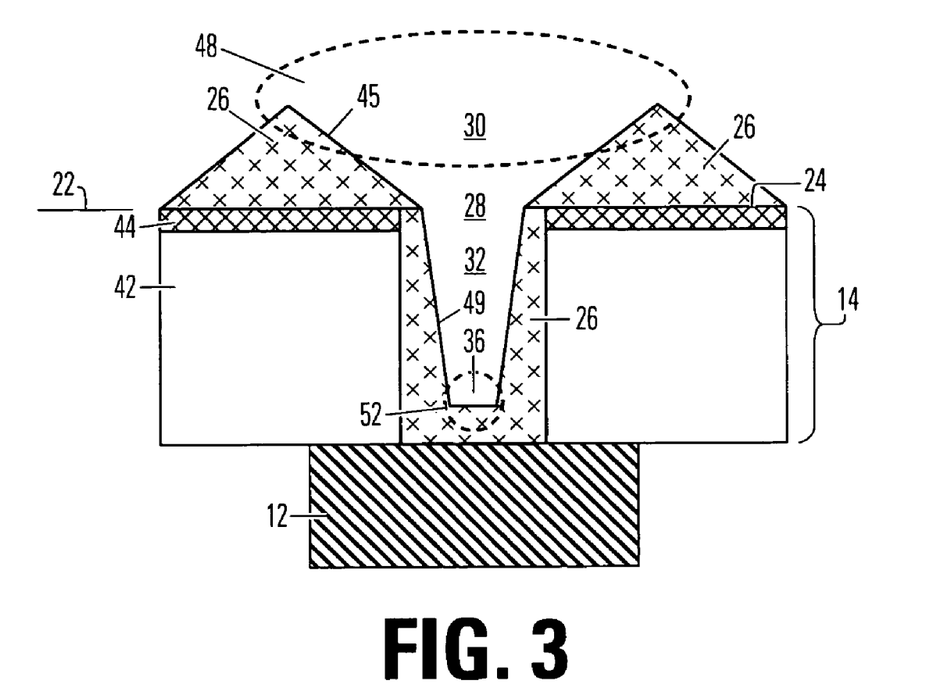
FIG. 3 illustrates the result of high density plasma chemical vapor deposition (HDP CVD) of a material on top of the separation layer and within the hole of FIG. 2, the deposition process creating a void having a downwardly and inwardly tapering void region within the hole.
Figure 4:
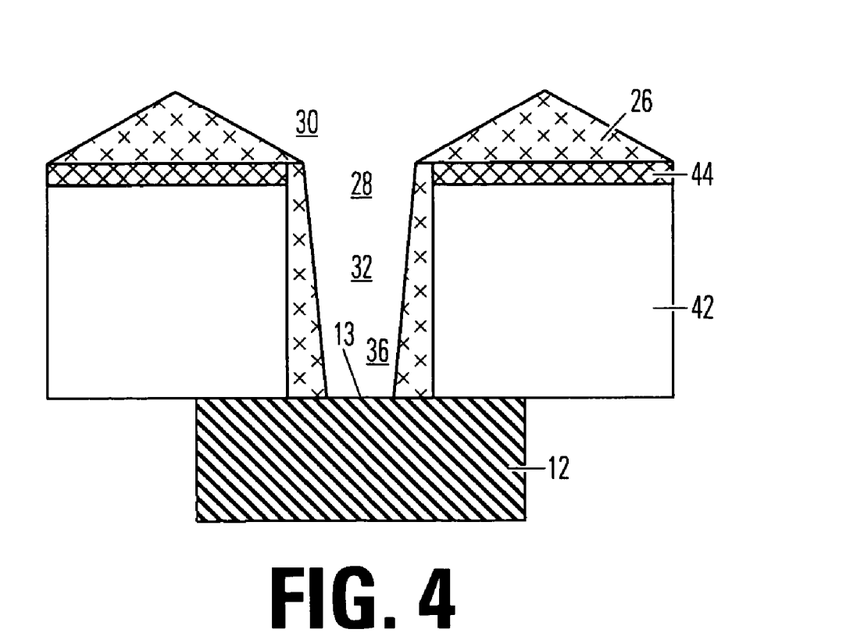
FIG. 4 illustrates the result of etching through the material deposited in FIG. 3 at the bottom of the void region to reach the first electrode.

FIG. 3 shows the results of the HDP CVD of material 26 onto surface and within hole 16. Material 26 is typically oxide but may be a low-k (low permittivity) film dielectric as well. The characteristic downwardly and inwardly tapering sidewalls 45 within first void region 30 defines a larger open area 48 at the entrance of first void region 30 while the downwardly and inwardly tapering sidewalls 49 within the second void region 32 define a smaller open area 52 at lower portion 36 of the second void region. As shown in FIG. 4, material 26 at lower portion 36 is then etched back to expose electrode surface 13 of the electrode 12. The diameter between sidewalls 49 at plane 22 is preferably about 15 to 5 nm, typically about 8 nm. The diameter between sidewalls 49 at electrode surface 13 is preferably about 10 to 1 nm, typically about 3 nm.

Figure 5:
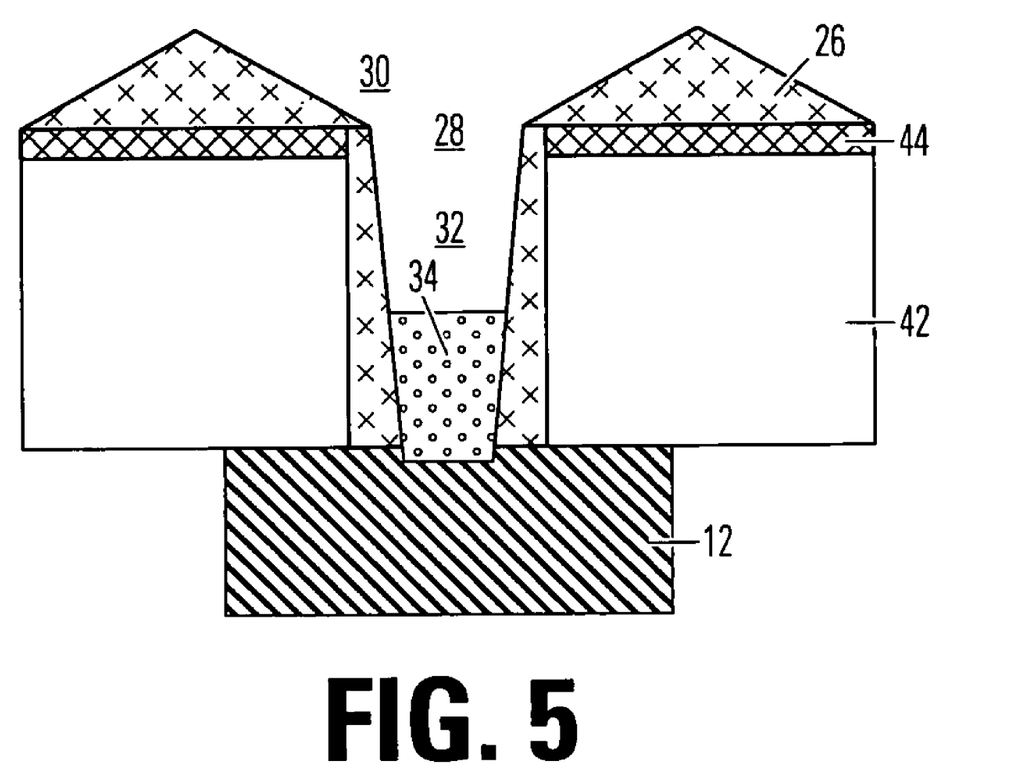
FIG. 5 shows the result of depositing a memory material at the bottom of the void region of FIG. 4.

Memory material 34 is then deposited onto the structure of FIG. 4 to arrive at the structure of FIG. 5. It is important to minimize the volume of memory material 34 to confine current flow 40 through a relatively small volume of material. The use of HDP CVD to deposit material 26 provides the characteristic downwardly and inwardly tapering sidewalls 45, 49 to aid proper deposition of memory material 34 within second void region 32. Appropriate processing steps, such as depositing a film over whole structure and then etching back to remove the film from everywhere except lower portion 36 of second void region 32, may be used to reduce the volume of memory material 34 deposited on the structure of FIG. 4. The memory material could be deposited by sputtering deposition under the condition of pressure 5~50 mT, power about 1000 W, with N2 or Ar gas. The target of sputtering deposition is as follows. If only Ar gas is used, then the target may be GeSbTe. If Ar/N2 gas is used, the target may be N2-GeSbTe. Memory material 34 preferably has a thickness or height above first electrode 12 of about 100 to 10 nm, typically about 30 nm. An example of an HDP recipe is as follows: $SiH_4$: 95 sccm/Ar: 390 sccm/O2: 150 sccm/Plasma Heat ~300 C/Top plasma power 3550 W/Bottom Plasma power 2700 W.

One of the advantages of the present invention is that entire process discussed above can be carried out without the need for chemical mechanical polishing; the resulting process is therefore simplified significantly. The use of HDP CVD provides better fill within hole 16 compared with conventional CVD processes. Also, the process can be carried out with smaller diameter holes 16 thus resulting in higher aspect ratios. The invention facilitates scaling so that the process should work as critical dimensions on chips shrink.

Electrodes 12, 38 in the illustrated embodiment are preferably made of TiN. Although other materials, such as TaN, TiAlN or TaAlN, may be used for electrodes 12, 38, TiN is presently preferred because it makes good contact with GST (discussed below) as memory material 34, it is a common material used in semiconductor manufacturing, and it provides a good diffusion barrier at the higher temperatures at which GST-type of memory material 34 transitions, typically in the 600-700° C. range.

Embodiments of memory cell device 10 include phase change based memory materials, including chalcogenide based materials and other materials, for memory material 34. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb100_{-(a+b)}$.

One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, columns 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. A material useful for implementation of an RRAM device described herein is $Ge_2Sb_2Te_5$, commonly referred to as GST. Other types of phase change materials can also be used.

The invention has been described with reference to phase change materials. However, other memory materials, also sometimes referred to as programmable materials, can also be used. As used in this application, memory materials are those materials having electrical properties, such as resistance, that can be changed by the application of energy; the change can be a stepwise change or a continuous change or a combination thereof. Other programmable resistive memory materials may be used in other embodiments of the invention, including N2 doped GST, $Ge_xSb_y$, or other material that uses different crystal phase changes to determine resistance; $Pr_xCa_yMnO_3$, PrSrMnO, $ZrO_x$, or other material that uses an electrical pulse to change the resistance state; 7,7,8,8-tetracyanoquinodimethane (TCNQ), methanofullerene 6,6-phenyl C61-butyric acid methyl ester (PCBM),TCNQ-PCBM, Cu-TCNQ, Ag-TCNQ, C60-TCNQ, TCNQ doped with other metal, or any other polymer material that has bistable or multi-stable resistance state controlled by an electrical pulse. Further examples of programmable resistive memory materials include GeSbTe, GeSb, NiO, Nb—SrTiO$_3$, Ag—GeTe, PrCaMnO, ZnO, Nb$_2$O$_5$, Cr—SrTiO$_3$.

The following are short summaries describing four types of resistive memory materials.

1. Challecogenide Material $Ge_xSb_yTe_z$ x:y:z=2:2:5

Or other compositions with x: 0~5; y: 0~5; z: 0~10

GeSbTe with doping, such as N—, Si—, Ti—, or other element doping may also be used.

Formation method: By PVD sputtering or magnetron-sputtering method with reactive gases of Ar, N$_2$, and/or He, etc @ the pressure of 1 mtorr~100 mtorr. The deposition is usually done at room temperature. The collimater with aspect ratio of 1~5 can be used to improve the fill-in performance. To improve the fill-in performance, the DC bias of several ten to several hundred volts is also used. On the other hand, the combination of DC bias and the collimater can be used simultaneously.

The post deposition annealing treatment with vacuum or N2 ambient is sometimes needed to improve the crystallize state of challecogenide material. The annealing temperature typically ranges 100 C to 400 C with an anneal time of less than 30 minutes.

The thickness of challecogenide material depends on the design of cell structure. In general, a challecogenide material with thickness of higher than 8 nm can have a phase change characterization so that the material exhibits at least two stable resistance states.

2. CMR (Colossal Magnetoresistance) Material $Pr_xCa_yMnO_3$ x:y=0.5:0.5

Or other compositions with x: 0~1; y: 0~1

Another CMR material that includes Mn oxide may be used

Formation method: By PVD sputtering or magnetron-sputtering method with reactive gases of Ar, N$_2$, O$_2$, and/or He, etc. at the pressure of 1 mtorr~100 mtorr. The deposition temperature can range from room temperature to ~600 C, depending on the post deposition treatment condition. A collimater with an aspect ratio of 1~5 can be used to improve the fill-in performance. To improve the fill-in performance, the DC bias of several ten to several hundred volts is also used. On the other hand, the combination of DC bias and the collimater can be used simultaneously. A magnetic field of several ten gauss to 10,000 gauss may be applied to improve the magnetic crystallized phase.

The post deposition annealing treatment with vacuum or $N_2$ ambient or $O_2/N_2$ mixed ambient may be needed to improve the crystallized state of CMR material. The annealing temperature typically ranges 400 C to 600 C with an anneal time of less than 2 hours.

The thickness of CMR material depends on the design of cell structure. The CMR thickness of 10 nm to 200 nm can be used to be the core material.

A buffer layer of YBCO (YBaCuO3, a kind of high temperature superconductor material) is often used to improve the crystallized state of CMR material. The YBCO is deposited before the deposition of CMR material. The thickness of YBCO ranges 30 nm to 200 nm.

3. 2-Element Compound $Ni_xO_y$; $Ti_xO_y$; $Al_xO_y$; $W_xO_y$; $Zn_xO_y$; $Zr_xO_y$; $Cu_xO_y$; etc
x:y=0.5:0.5
Other compositions with x: 0~1; y: 0~1
Formation method:
1. Deposition: By PVD sputtering or magnetron-sputtering method with reactive gases of Ar, $N_2$, $O_2$, and/or He, etc. at the pressure of 1 mtorr~100 mtorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually done at room temperature. A collimater with an aspect ratio of 1~5 can be used to improve the fill-in performance. To improve the fill-in performance, the DC bias of several ten to several hundred volts is also used. If desired, they combination of DC bias and the collimater can be used simultaneously.

The post deposition annealing treatment with vacuum or $N_2$ ambient or $O_2/N_2$ mixed ambient as sometimes needed to improve the oxygen distribution of metal oxide. The annealing temperature ranges 400 C to 600 C with an anneal time of less than 2 hours.

2. Reactive deposition: By PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mtorr~100 mtorr, using a target of metal oxide, such as Ni, Ti, Al, W, Zn, Zr, or Cu etc. The deposition is usually done at room temperature. A collimater with an aspect ratio of 1~5 can be used to improve the fill-in performance. To improve the fill-in performance, a DC bias of several ten to several hundred volts is also used. If desired, the combination of DC bias and the collimater can be used simultaneously.

The post deposition annealing treatment with vacuum or $N_2$ ambient or $O_2/N_2$ mixed ambient is sometimes needed to improve the oxygen distribution of metal oxide. The annealing temperature ranges 400 C to 600 C with an anneal time of less than 2 hours.

3. Oxidation: By a high temperature oxidation system, such as furnace or RTP system. The temperature ranges from 200 C to 700 C with pure $O_2$ or $N_2/O_2$ mixed gas at a pressure of several mtorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mtorr to 100 mtorr is used to oxidize the surface of metal, such as Ni, Ti, Al, W, Zn, Zr, or Cu etc.

The oxidation time ranges several seconds to several minutes. The oxidation temperature ranges room temperature to 300 C, depending on the degree of plasma oxidation.

4. Polymer Material

TCNQ with doping of Cu, $C_{60}$, Ag etc.
PCBM-TCNQ mixed polymer
Formation method:
1. Evaporation: By thermal evaporation, e-beam evaporation, or molecular beam epitaxy (MBE) system. A solid-state TCNQ and dopent pellets are co-evaporated in a single chamber. The solid-state TCNQ and dopent pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of 10-4 torr to 10-10 torr. The wafer temperature ranges from room temperature to 200 C.

The post deposition annealing treatment with vacuum or $N_2$ ambient is sometimes needed to improve the composition distribution of polymer material. The annealing temperature ranges room temperature to 300 C with an anneal time of less than 1 hour.

2. Spin-coat: By a spin-coater with the doped-TCNQ solution @ the rotation of less than 1000 rpm. After spin-coating, the wafer is put to wait the solid-state formation @ room temperature or temperature of less than 200 C. The waiting time ranges from several minutes to days, depending on the temperature and on the formation conditions.

For additional information on the manufacture, component materials, use and operation of phase change random access memory devices, see U.S. patent application Ser. No. 11/155,067, filed 17 Jun. 2005, entitled Thin Film Fuse Phase Change Ram And Manufacturing Method.

The above descriptions may have used terms such as above, below, top, bottom, over, under, et cetera. These terms are used to aid understanding of the invention are not used in a limiting sense.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

Any and all patents, patent applications and printed publications referred to above are hereby incorporated by reference.

What is claimed is:

1. A memory cell device of the type including a memory material switchable between electrical property states by the application of energy, the memory cell device comprising:
 a first electrode having an electrode surface;
 a first material over the electrode surface to create a separation layer having an upper surface;
 the first material defining a hole bounded by a side wall within the separation layer, a bottom and a plane defined by the upper surface;
 a second material on the side wall;
 a third material on the upper surface of the separation layer;
 the third material defining a first downwardly and inwardly tapering void region above the plane of the upper surface;

the second material having a tapering cross-sectional shape and defining a void, the void having a second downwardly and inwardly tapering void region below the plane of the upper surface;
a memory material in at least a portion of the second void region and in electrical contact with the electrode surface; and
a second electrode in electrical contact with the memory material;
whereby energy passing between the first and second electrodes is concentrated within the memory material so to facilitate changing an electrical property state of the memory material.

2. The memory cell device according to claim 1 wherein the memory material comprises a phase change material.

3. The memory cell device according to claim 1 wherein the second material comprises a high density plasma-deposited material.

4. The memory cell device according to claim 1 wherein the second material comprises the third material.

5. The memory cell device according to claim 1 wherein the first material comprises an intermetal dielectric material and a stop layer at the upper surface.

6. The memory cell device according to claim 1 wherein the second material comprises an oxide.

7. The memory cell device according to claim 1 wherein the resistance of the memory material changes when the electrical property state of the memory material changes.

8. The memory cell device according to claim 1 wherein:
the second void region has an upper portion and a lower portion, the memory material being in the lower portion of the second void region; and
the second electrode is over the second material and within the upper portion of the second void region and in direct contact with the memory material.

9. The memory cell device according to claim 1 wherein the bottom is at or above the electrode surface.

10. A memory cell device of the type including a phase change material switchable between generally amorphous and generally crystalline states by the application of energy, the memory cell device comprising:
a first electrode having an electrode surface;
a first material over the electrode surface to create a separation layer having an upper surface;
the first material defining a hole bounded by a side wall within the separation layer, a bottom and a plane defined by the upper surface;
a high density plasma-deposited second material on the side wall and on the upper surface of the separation layer;
the second material defining a void, the void having a first downwardly and inwardly tapering void region above the plane of the upper surface and a second downwardly and inwardly tapering void region below the plane of the upper surface, the second void region having an upper portion and a lower portion;
a phase change material in the lower portion of the second void region and in direct electrical contact with the electrode surface; and
a second electrode over the second material and within the upper portion of the second void region and in direct contact with the phase change material;
whereby energy passing between the first and second electrodes is concentrated within the phase change material at the electrode surface so to facilitate changing the electrical resistance of the phase change material.

* * * * *

UNITED STATES PATENT AND TRADEMARK OFFICE
CERTIFICATE OF CORRECTION

PATENT NO. : 7,599,217 B2  Page 1 of 1
APPLICATION NO. : 11/357902
DATED : October 6, 2009
INVENTOR(S) : Lai et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 362 days.

Signed and Sealed this

Twenty-eighth Day of September, 2010

David J. Kappos
*Director of the United States Patent and Trademark Office*